United States Patent [19]

Jun

[11] Patent Number: 5,684,331

[45] Date of Patent: Nov. 4, 1997

[54] MULTILAYERED INTERCONNECTION OF SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 482,001

[22] Filed: Jun. 7, 1995

[51] Int. Cl.⁶ .......................... H01L 23/48; H01L 23/52; H01L 29/40

[52] U.S. Cl. .......................... 257/758; 257/763; 257/773; 257/774; 257/775

[58] Field of Search .................. 257/763, 774, 257/758, 773, 775

[56] References Cited

U.S. PATENT DOCUMENTS

| | | | |
|---|---|---|---|
| 3,848,260 | 11/1974 | Tsunemitsu et al. | 257/763 |
| 4,582,563 | 4/1986 | Hazuki et al. | 156/643 |
| 4,866,009 | 9/1989 | Matsuda | 437/203 |
| 4,917,759 | 4/1990 | Fisher et al. | 257/763 |
| 4,920,072 | 4/1990 | Keller et al. | 257/263 |
| 5,216,282 | 6/1993 | Cote et al. | 257/763 |
| 5,262,352 | 11/1993 | Woo et al. | 437/189 |
| 5,294,836 | 3/1994 | Kishi | 257/763 |

FOREIGN PATENT DOCUMENTS 1-300544  12/1989  Japan ..................... 257/763

OTHER PUBLICATIONS

"Simulation of Tungsten Etchback for Via and Contact Plugs", Hsiau et al., VMIC Conference, 1994 ISMIC—103/94/0545, pp. 545–547, Jun. 7–8, 1994.

Primary Examiner—Mahshid D. Saadat
Assistant Examiner—T. M. Arroyo
Attorney, Agent, or Firm—Morgan, Lewis and Bockius LLP

[57] ABSTRACT

A multilayered interconnection of a semiconductor device includes a substrate, an underside interconnection layer formed on the substrate, an interlayer insulation film formed on the underside interconnection layer, an upperside interconnection layer formed on the interlayer insulation film, a contact hole formed through the upperside interconnection layer and into the interlayer insulation film, and a plug formed in the contact hole so that the plug contacts an upper part of the underside interconnection layer and a side of the upperside interconnection layer.

11 Claims, 16 Drawing Sheets

$A_0 = a \cdot a$ $A_1 = 4a \cdot h$ $A_2 = 2(a+b) \cdot h$

F I G. 13A
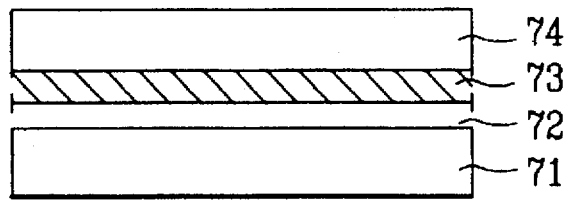
F I G. 13B
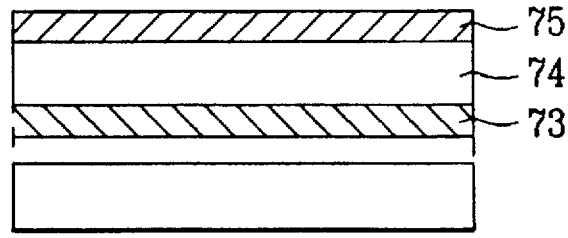
F I G. 13C
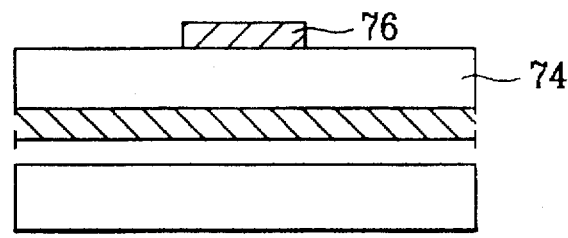
F I G. 13D
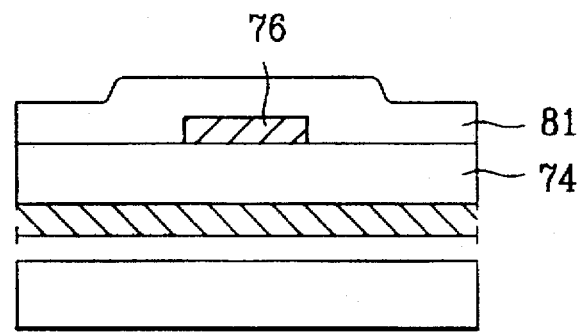
F I G. 13E
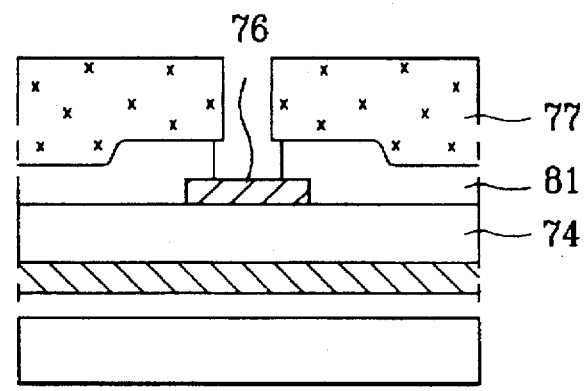

MULTILAYERED INTERCONNECTION OF SEMICONDUCTOR DEVICE

BACKGROUND OF THE INVENTION

This invention relates to a semiconductor device, and more particularly to a multilayered interconnection of a semiconductor device and a method for forming the same, which can reduce the contact resistance and improve the reliability of a semiconductor device and which is suitable for high density integration of semiconductor devices.

As the density of integration of a semiconductor device becomes higher with the minimum width of the semiconductor device submicronized to below 0.5 µm, a contact hole for interconnecting an upperside connection layer and an underside connection layer has been also submicronized, with a ratio of the depth to the width of the contact hole increased.

Therefore, due to degradation of step coverage in the case where an interconnection layer is formed in the contact hole with a conventional physical deposition method of a sputtering method, there have been problems of increase of a contact resistance and reduction of an endurance by electromigration and stress migration.

As the methods of forming a plug in the contact hole for improving the step coverage of the contact hole, there are an art of forming the plug in the contact hole by depositing tungsten on an insulation film including the contact hole and subjecting the tungsten to etch back to a depth more than the deposited thickness, and an art of tungsten or aluminum selective growth in which a plug of tungsten or aluminum is selectively grown only in the contact hole.

FIGS. 1A to 1C show a conventional multilayered interconnection, wherein FIG. 1A shows a sectional view, FIG. 1B shows a plan view, and FIG. 1C shows a contact between an upperside interconnection layer and a plug.

Referring to FIG. 1A to and FIG. 1B, an underside interconnection layer 13 is formed to be in contact with the upperside interconnection layer 18 through a plug 17 formed in a contact hole. An interlayer insulation film 14 is formed between the upperside, and underside interconnection layers 13 and 18 for insulating them, and an underside insulation film 12 is formed between a substrate 11 and the underside interconnection layer 13 also for insulating them. The reference number 15' represents a contact.

The multilayered interconnection has the plug 17 for electric interconnection of the upperside and underside interconnection layers 13 and 18. Because the upperside interconnection layer 18 is in contact with the upper part of the plug 17, a contact area between the upperside interconnection layer 18 and the plug 17 is related to the dimension of the contact hole. If the dimension of the contact hole is a square of a×a, the area of contact $A_o$ is $A_o = a \times a$.

FIGS. 2A to 2E show processes for forming the multilayered interconnection of the semiconductor device of FIG. 1.

As shown in FIG. 2A, by forming an underside insulation film 12 on a semiconductor substrate 11, and forming and patterning a metal layer on the underside insulation film 12, an underside interconnection layer 13 is formed.

As shown in FIG. 2B, an interlayer insulation film 14 is formed on the underside insulation film 12 including the underside interconnection layer 13. A part of the interlayer insulation film 14 on the underside interconnection layer 13 is etched with a photoetching process to form a contact hole 15.

As shown in FIG. 2C, a conductive material 16 is deposited so as to fill the contact hole 15 with a blanket deposition.

As shown in FIG. 2D, the conductive material 16 is etched back into a plug 17.

In the plug formation process of FIGS. 2C and 2D, the plug can be formed by growing a conductive material in the contact hole with a selective growth method instead of the above method.

AS shown in FIG. 2E, by forming and patterning a metal layer on the plug 17 and the interlayer insulation film 14, an upper interconnection layer 18 is formed. Thus, the upperside interconnection layer 18 and the underside interconnection layer 13 are electrically connected through the plug 17.

However, the foregoing multilayered interconnection has following problems.

First, since the conventional multilayered interconnection is in contact with the upperside interconnection layer only at the upper part of the plug, the contact area between the upperside interconnection layer and the plug is reduced as the dimension of the contact hole is reduced. Accordingly, the conventional multilayered interconnection has had a problem of increased contact resistance due to the reduced contact area.

Second, in cases when misalignments of a contact mask for forming the contact hole and/or of a mask for forming the upperside interconnection layer should happen, the upperside interconnection layer can not be in full contact with the upper part of the plug, and with the contact area reduced the more, there has been a problem of the more increase of the contact resistance. Moreover, since the incomplete contact between the upperside interconnection layer and the plug causes not only an incomplete electrical connection between the upperside interconnection layer and the underside interconnection layer but also, sometimes results in an opening between the upperside interconnection layer and the plug: This leads to a defective device and a problem of significant degradation of the device reliability.

Third, in the case where the plug is formed in the submicron contact hole with a blanket deposition process and an etch back process, at depositing a conductive material with the blanket deposition process, since a full filling of the conductive material into the contact hole is hardly obtainable, as shown in FIG. 3A, a seam opening, as shown in FIG. 3B, can be formed after the etch back process.

SUMMARY OF THE INVENTION

The object of this invention is to solve the foregoing problems of the conventional art by providing a multilayered interconnection of a semiconductor device and a method for forming the same, which can reduce the contact resistance by increasing a contact area between the upperside interconnection layer and the plug.

Other object of this invention is to provide a multilayered interconnection of a semiconductor device and a method for forming the same, which can improve reliability of the semiconductor device by preventing defects due to misalignment of the mask.

Another object of this invention is to provide a multilayered interconnection of a semiconductor device and a method for forming the same, which can prevent development of seam opening when the interconnection is formed with a blanket deposition method and an etch back process.

A further object of this invention is to provide a multilayered interconnection of a semiconductor device and a method for forming the same, which is suitable for high density integration of semiconductor devices.

These and other objects and features of this invention can be achieved by providing a multilayered interconnection of a semiconductor device, including a substrate, an underside interconnection layer formed on the substrate, an interlayer insulation film formed on the underside interconnection layer, an upperside interconnection layer formed on the interlayer insulation film, a contact hole formed in the upperside interconnection layer and the interlayer insulation film, and a plug formed in the contact hole so that the plug is in contact with the underside interconnection layer at an upper part thereof and the upperside interconnection layer at sides thereof.

In the multilayered interconnection, a surface of each of the sides in the contact hole where the upperside interconnection layer and the plug are in contact is rectangular of which area is related to both a width of the contact hole and a thickness of the upperside interconnection layer. And, a surface of each of the sides in the contact hole where the upperside interconnection layer and the plug are in contact is trapezoidal, with a side of the trapezoid at the upper surface of the upperside interconnection layer being greater than a side of the trapezoid at the lower surface of the upperside interconnection layer, of which area is related to dimension of the contact hole at both the upper surface and the lower surface of the upperside interconnection layer, and the thickness of the upperside interconnection layer.

These and other objects and features of this invention can be achieved by providing a method for forming a multilayered interconnection of a semiconductor device, including processes for forming an underside interconnection layer on a substrate, forming an insulation film on the substrate including the underside interconnection layer, forming an upperside interconnection layer on the insulation film, forming a contact hole by etching the upperside interconnection layer and the insulation film, and forming a plug in contact with an upper surface of the underside interconnection layer and sides of the upperside interconnection layer for connecting the upperside, and underside interconnection layers. In the method for forming the multilayered interconnection, by subjecting the upperside interconnection layer and the insulation film to isotropic etching, a contact hole that has identical dimensions both at the upper surface and the lower surface of the upperside interconnection layer is formed. And by subjecting the insulation film to anisotropic etching after subjecting the upperside interconnection layer to isotropic etching, a contact hole having sloped sides can be formed.

BRIEF DESCRIPTION OF THE DRAWINGS

FIGS. 13A–13J show another processes for forming the multilayered interconnection of the semiconductor device of FIG. 9B illustrated in sections across line 9B–9B'.

DETAILED DESCRIPTION OF THE INVENTION

Figure 1A:
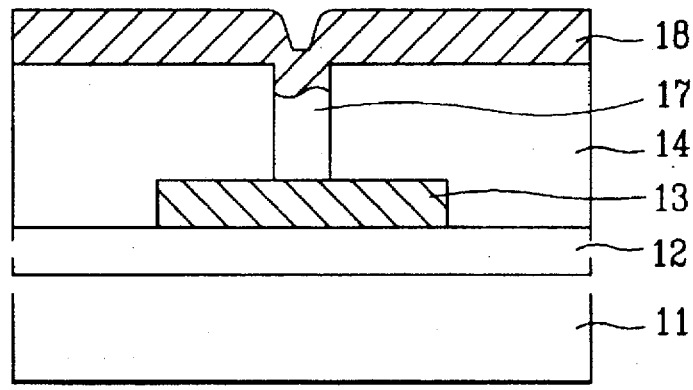
FIGS. 1A to 1C show a conventional multilayered interconnection of a semiconductor device.
Figure 1B:
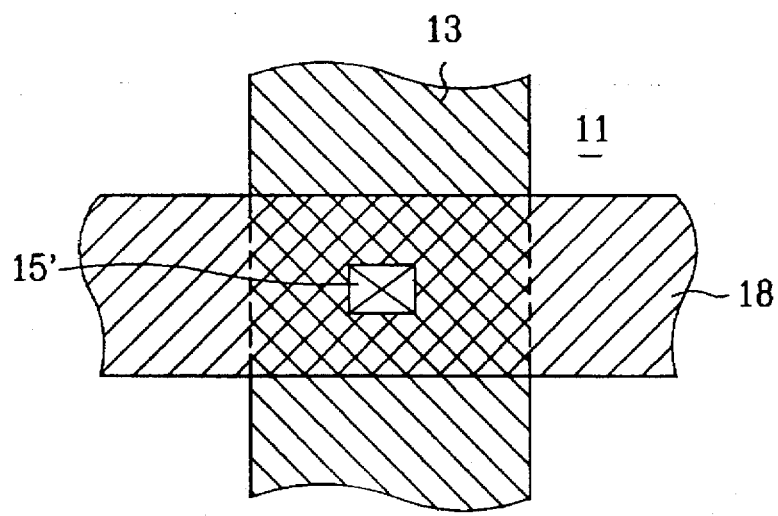
Figure 1C:
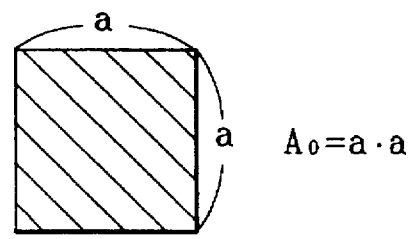
Figure 2A:
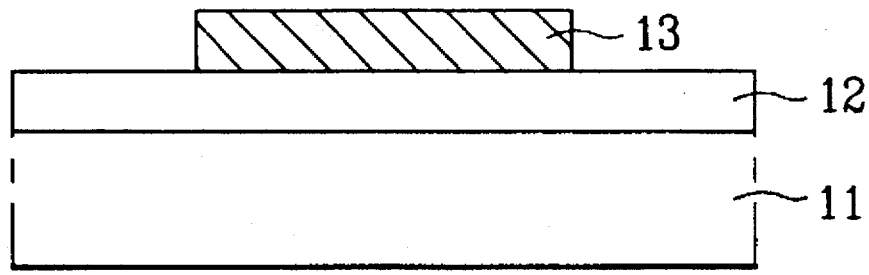
FIGS. 2A to 2E show processes for forming the conventional multilayered interconnection.
Figure 2B:
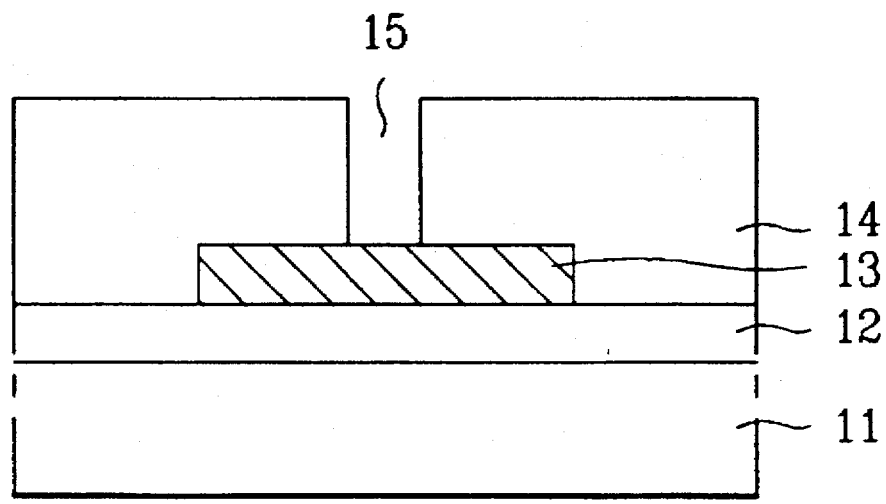
Figure 2C:
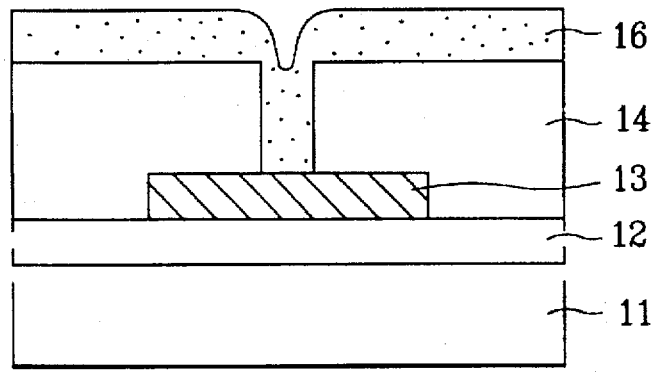
Figure 2D:
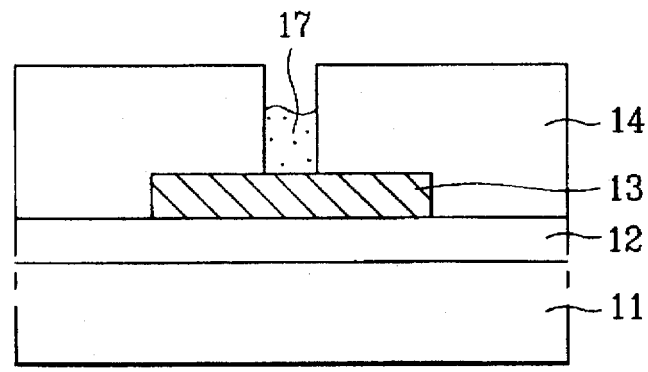
Figure 2E:
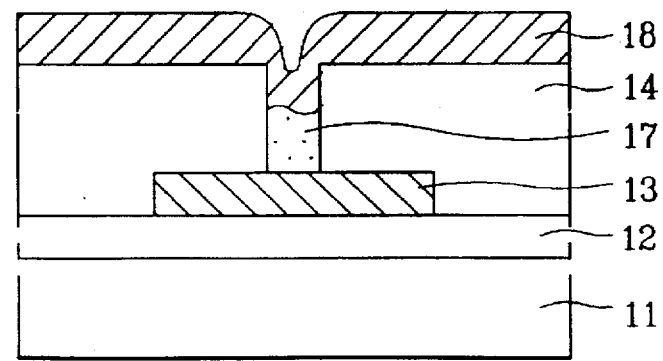
Figure 3A:
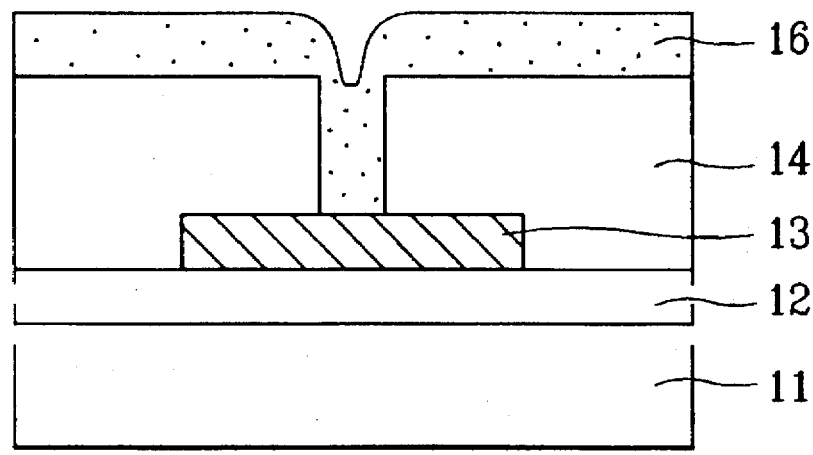
FIGS. 3A and 3B illustrate problems of the conventional multilayered interconnection.
Figure 3B:
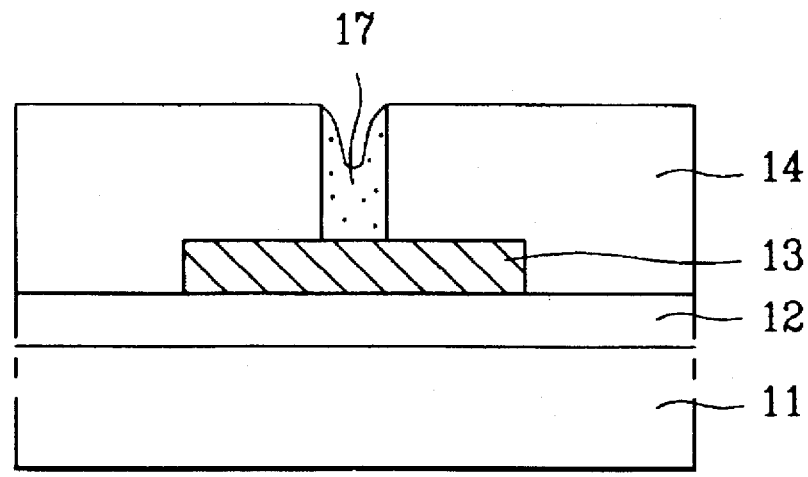
Figure 4A:
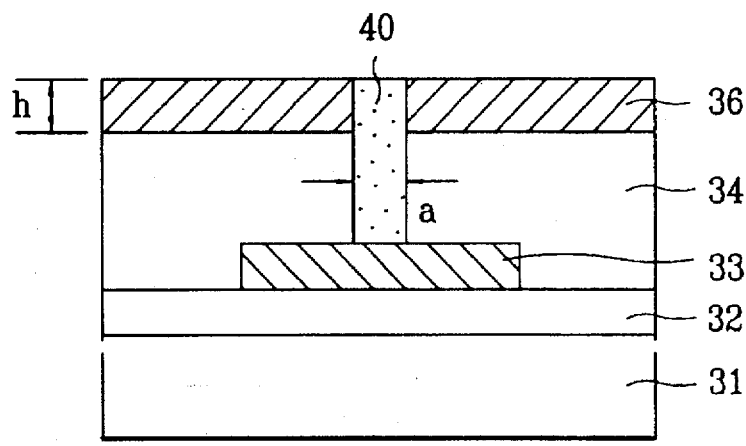
FIGS. 4A–4C show a first embodiment of a multilayered interconnection of a semiconductor device in accordance with this invention.
Figure 4B:
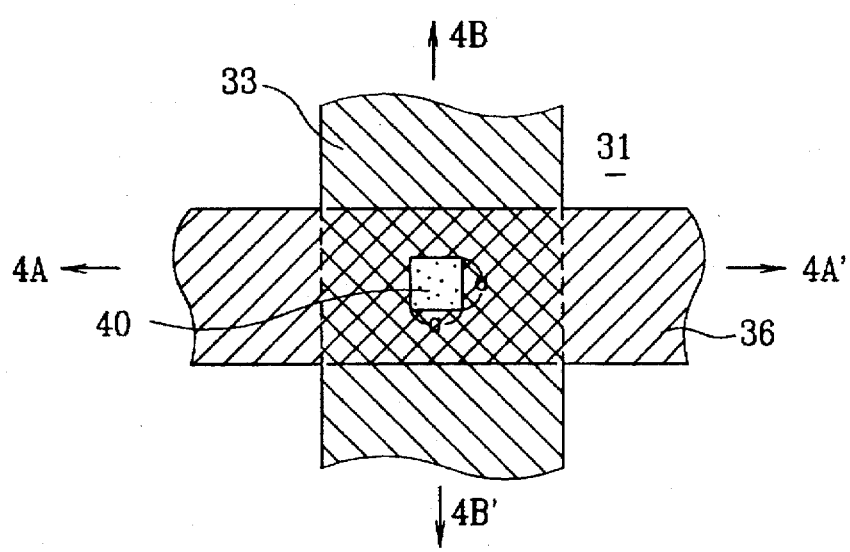
Figure 4C:
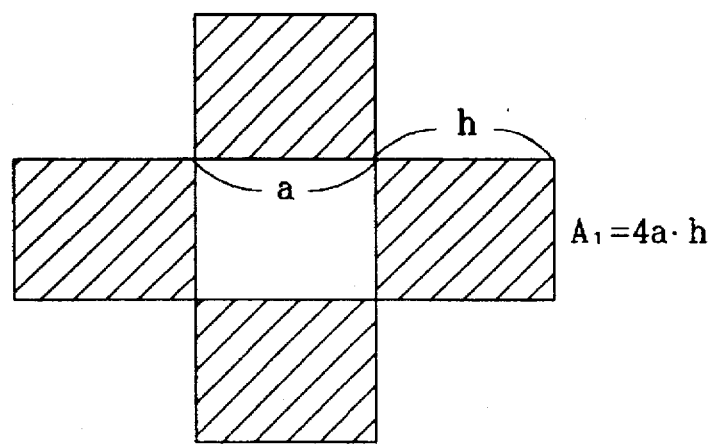

FIGS. 4A–4C show a first embodiment of a multilayered interconnection of a semiconductor device in accordance with this invention, wherein FIG. 4A shows a sectional view, FIG. 4B shows a plan view, and FIG. 4C shows a condition of a contact between an upperside interconnection layer and a plug in a contact hole.

Referring to FIGS. 4A–4C, an underside interconnection layer 33 is formed so as to be connected to an upperside interconnection layer 36 through a plug 40 formed in the contact hole. An interlayer insulation film 34 is formed between the upperside and underside interconnection layers 33 and 36 an insulation between the two layers. An underside insulation film 32 is formed between a substrate 31 and the underside interconnection layer 33 as insulation between these two layers.

Since the first embodiment of the multilayered interconnection has its contact hole formed to extend not only in the interlayer insulation film 34 but also in the upperside interconnection layer 36, the plug 40 is also formed up to an upper surface of the upperside interconnection layer 36 as shown in FIG. 4B. Therefore, the upperside interconnection layer 36 is made to be in contact with the plug 40 at four sides thereof with each of the contact surfaces formed rectangular, of which area is related not only to the dimension but also the deposited thickness of the upperside interconnection layer 36.

Therefore, as shown in FIG. 4C, if the dimension of the contact hole is a square of a×a, and the deposited thickness of the upperside interconnection layer 36 is h, the total contact area A1 is A1=4×a×h.

The first embodiment of the multilayered interconnection can reduce a the contact resistance because of the increased contact area by the side contact of the upperside interconnection layer 36 and the plug 40.

FIGS. 5A–5H show processes for forming the multilayered interconnection of the semiconductor device of FIG. 4B illustrated in sections across line 4A–4A', and FIGS.6A–6H show processes for forming the multilayered interconnection of the semiconductor device of FIG. 4B illustrated in sections across line 4B–4B'.

Figure 5A:
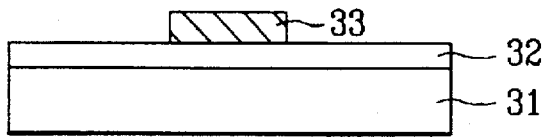
FIGS. 5A–5H show processes for forming the multilayered interconnection of the semiconductor device of FIG. 4B illustrated in section across line 4A–4A'.
Figure 6A:
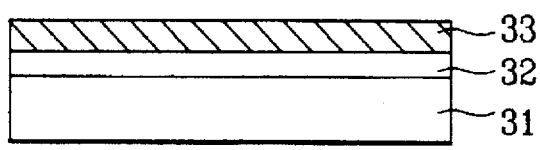
FIGS. 6A–6H show processes for forming the multilayered interconnection of the semiconductor device of FIG. 4B illustrated in sections across line 4B–4B'.

As shown in FIGS. 5A and 6A, an underside insulation film 32 is formed of an oxide film on a semiconductor substrate 31 with a chemical vapor deposition method or a spin coating method, and a metal layer, such as aluminum, is deposited on the underside insulation film 32 by a sputtering method and is subjected to patterning to form an underside interconnection layer 33.

Figure 5B:
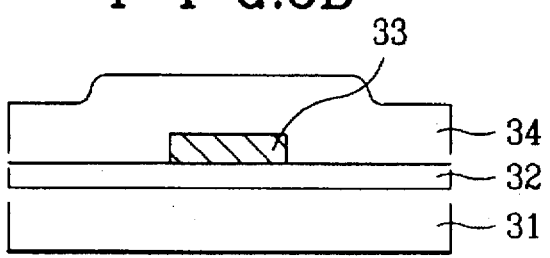
Figure 6B:
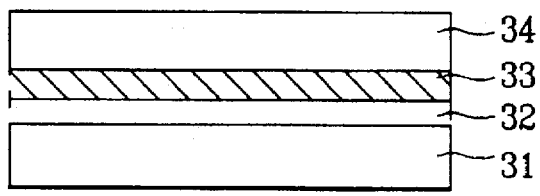

As shown in FIGS. 5B and 6B, as an interlayer insulation film 34, an oxide film is formed on the underside insulation film 32 including the underside interconnection layer 33 by a chemical vapor deposition method or a spin coating method.

Figure 5C:
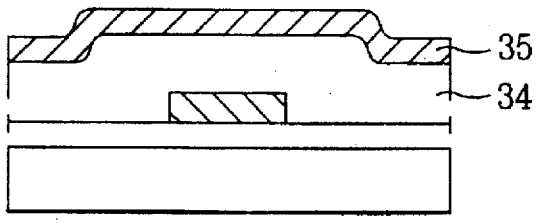
Figure 6C:
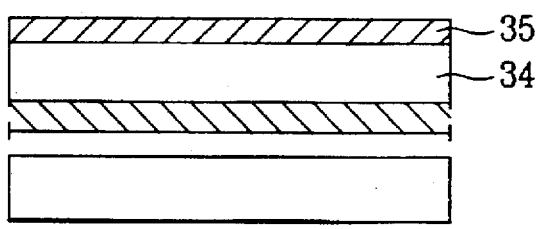
Figure 5D:
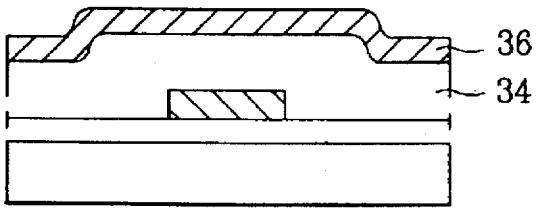
Figure 6D:
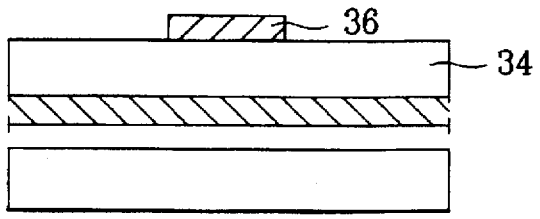

As shown in FIGS. 5C and 6C, by forming and patterning a metal layer 35, such as aluminum, on the interlayer insulation film 34 with a sputtering method, as shown in FIGS. 5D and 6D, an upperside interconnection layer 36 is formed.

Figure 5E:
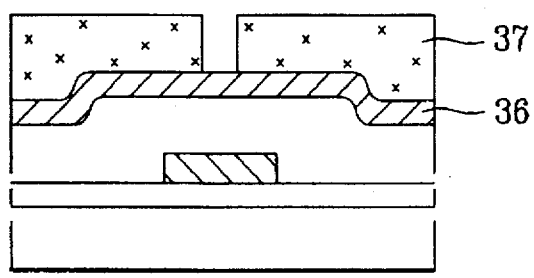
Figure 6E:
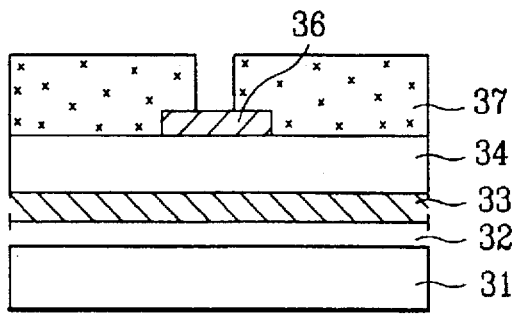

As shown in FIGS.5E and 6E, by forming and patterning a photosensitive film 37 on the interlayer insulation film 34 including the upperside interconnection layer 36, a part of the upperside interconnection layer 36 is exposed.

Figure 5F:
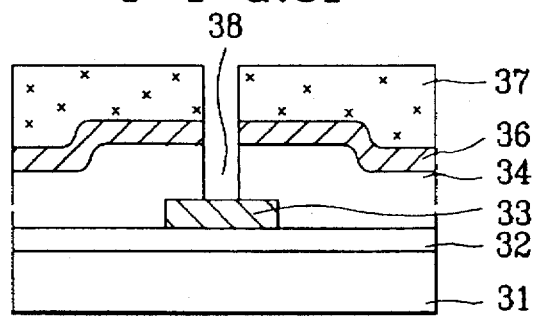
Figure 6F:
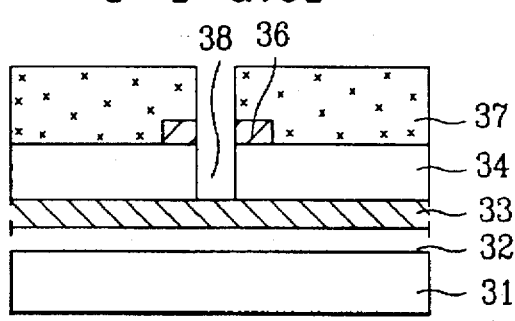

As shown in FIGS. 5F and 6F, the exposed upperside interconnection layer 36 is etched with the photosensitive film used as a mask, and then, the underlying interlayer insulation film 34 is etched into a contact hole 38. According to this, the underside interconnection layer 33 is exposed in the contact hole 38.

Figure 5G:
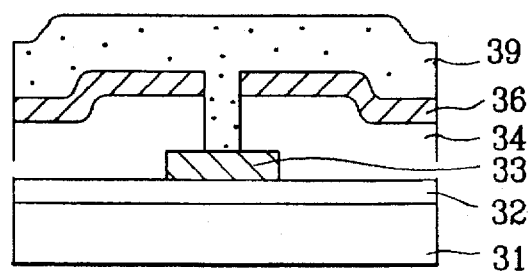
Figure 6G:
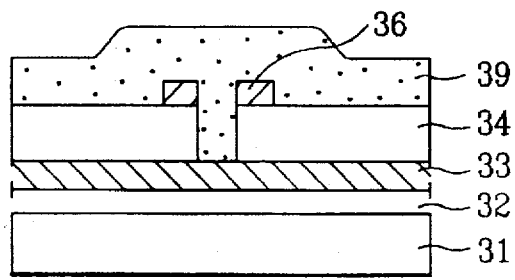
Figure 5H:
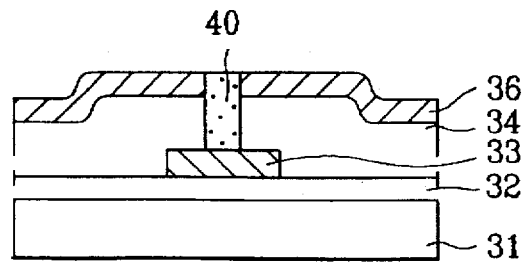
Figure 6H:
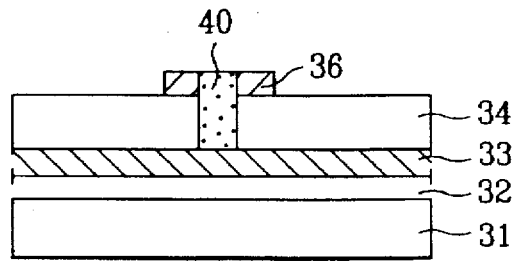
Figure 8A:
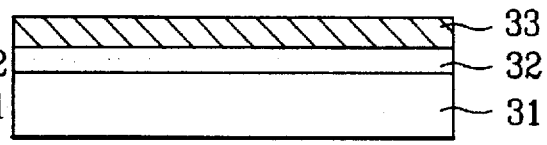
FIGS. 8A–8I show another processes for forming the multilayered interconnection of the semiconductor device of FIG. 4B illustrated in sections across line 4B–4B'.
Figure 8B:
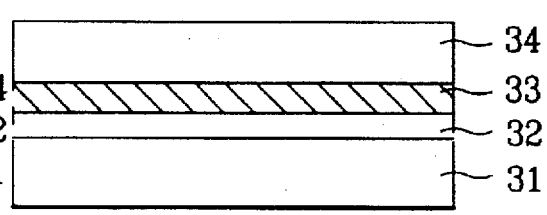
Figure 8C:
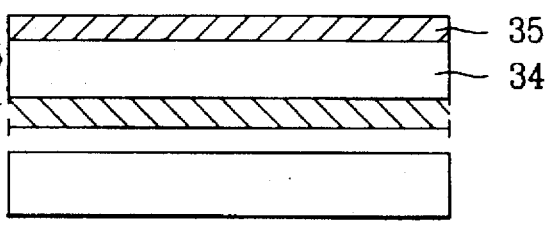
Figure 8D:
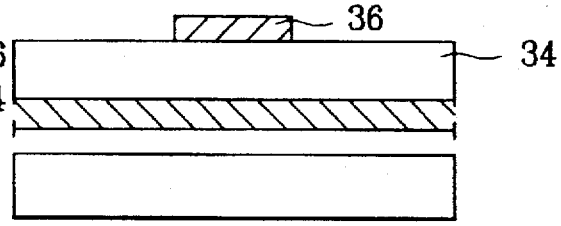

As shown in FIGS. 5G and 6G, after removing the photosensitive film 37, a conductive material 39, such as tungsten or aluminum, is deposited on the upperside interconnection layer 36 with a blanket deposition method so that the contact hole is fully filled. As shown in FIGS. 5H and 6H, the conductive material 39 is etched back to form a plug 40 in the contact hole 38.

As the plug 40 has been formed, the underside interconnection layer and the upperside interconnection layer are electrically connected.

The plug 40 can be formed only in the contact hole 38 in the by selective growth of a conductive material in the therein.

FIGS. 7A–7I show other processes for forming the multilayered interconnection of the semiconductor device of FIG. 4B illustrated in sections across line 4A–4A', and FIGS.8A–8I show these other processes for forming the multilayered interconnection of the semiconductor device of FIG. 4B illustrated in sections across line 4B–4B'.

As shown in FIGS. 7A and 8A to FIGS.7D and 8D, to form the multilayered interconnection of a semiconductor device of the first embodiment in other processes, an underside insulation film 32 is formed of an oxide film on a semiconductor substrate 31 with a chemical vapor deposition method or a spin coating method, on which an underside interconnection layer 33 is formed.

An interlayer insulation film 34 is formed on an oxide film on the underside insulation film 32 including the underside interconnection layer 33 with a chemical vapor deposition method or spin coating method, on which an upperside interconnection layer 36 is formed by depositing and patterning a metal layer 35 thereon.

Figure 7A:
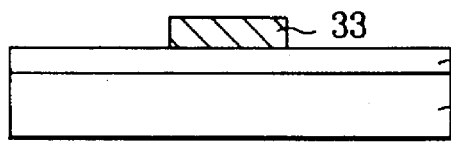
FIGS. 7A–7I show another processes for forming the multilayered interconnection of the semiconductor device of FIG. 4B illustrated in sections across line 4A–4A'.
Figure 7B:
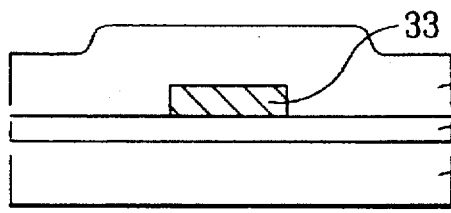
Figure 7C:
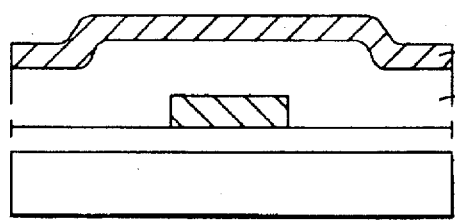
Figure 7D:
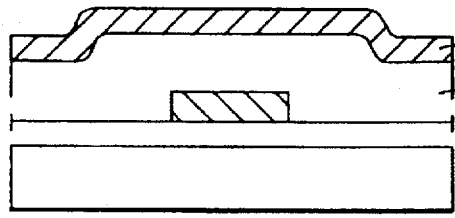
Figure 7E:
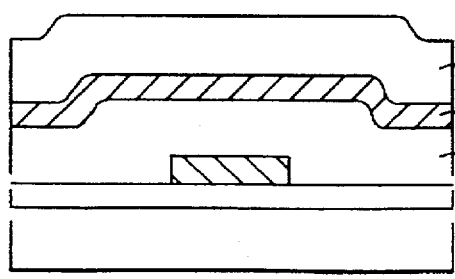
Figure 8E:
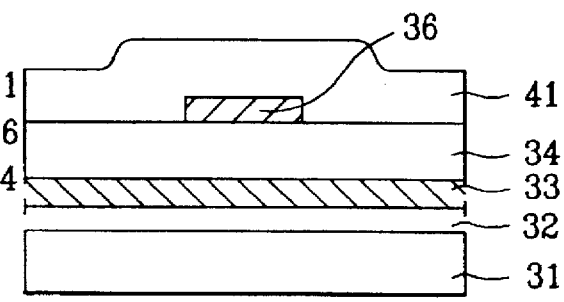
Figure 7F:
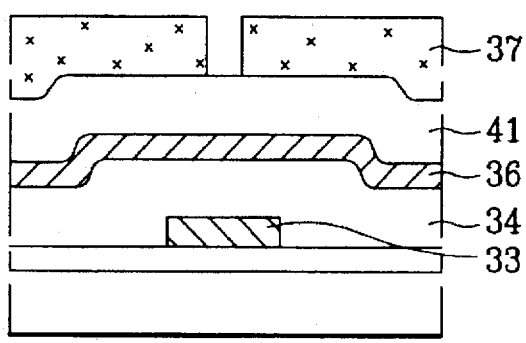
Figure 8F:
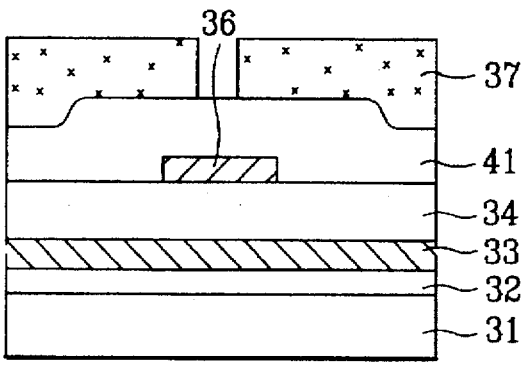

Then, as shown in FIGS.7E and 8E, an upperside insulation film 41 is formed on the interlayer insulation film 34 including the upperside interconnection layer 36 with a chemical vapor deposition method or spin coating method, and as shown in FIGS.7F and 8F, by coating and patterning a photosensitive film 37 on the upperside insulation film 41, a part of the upperside insulation film 41 is exposed.

Figure 7G:
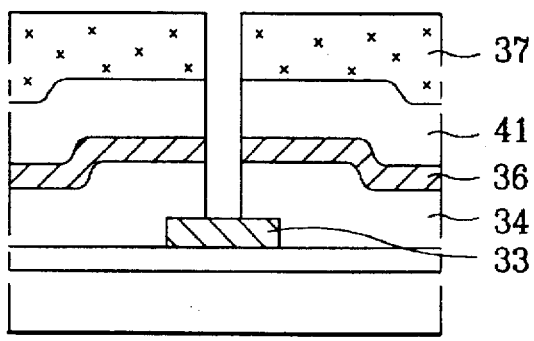
Figure 8G:
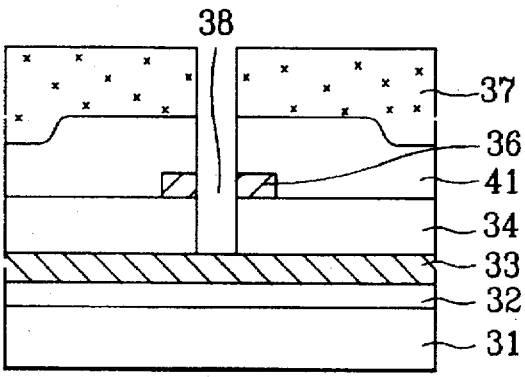

As shown in FIGS.7G and 8G, by etching the exposed upperside insulation film 41 with the photosensitive film 37 used as a mask, and then etching the underlying upperside interconnection layer 36 and interlayer insulation film 34, a contact hole 38 is formed. In this manner the underside interconnection layer 33 is exposed in the contact hole 38.

Figure 7H:
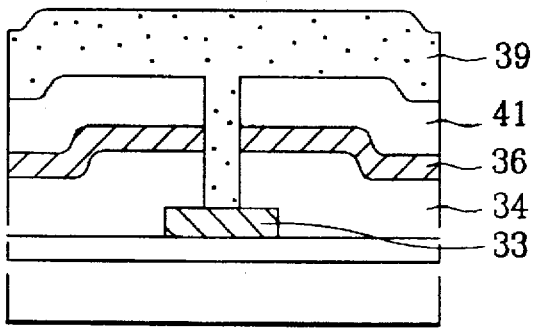
Figure 8H:
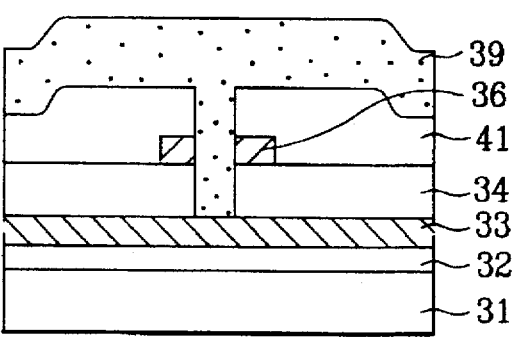
Figure 7I:
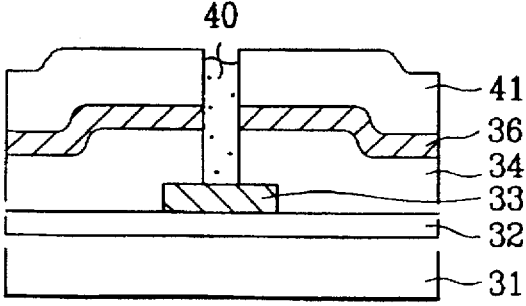
Figure 8I:
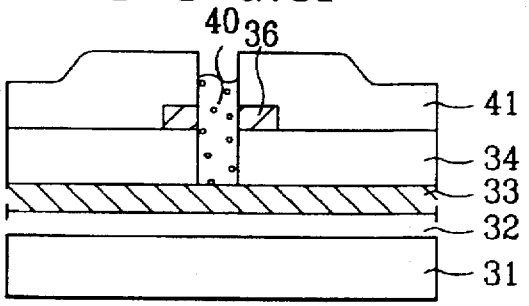

As shown in FIGS.7H and 8H, a conductive material 39 is deposited on the upperside interconnection layer 41 with a blanket deposition method so that the contact hole 38 is fully filled, and as shown in FIGS.7I and 8I, the conductive material 39 is etched back to form a plug 40 in the contact hole 38. According to the formation of the plug, the underside interconnection layer 33 and the upperside interconnection layer 36 are connected electrically.

The upperside insulation film 41 serves to protect damage to the upperside interconnection layer 36 when the conductive material is etched.

Alternatively, the plug 40 can be formed only in the contact hole 38 by selective growth of a conductive material therein.

Figure 9A:
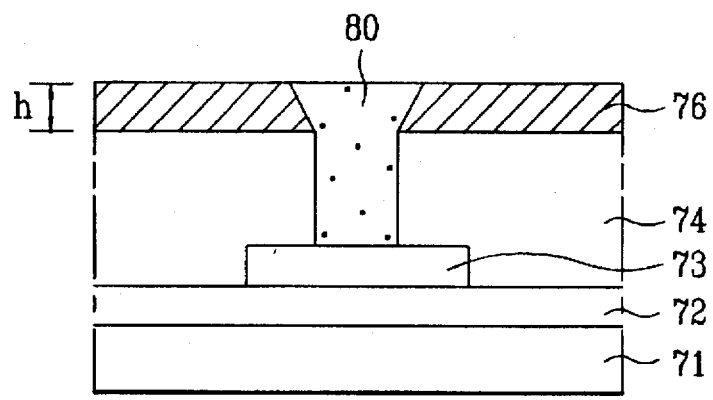
FIGS. 9A–9C show a second embodiment of a multilayered interconnection of a semiconductor device in accordance with this invention.
Figure 9B:
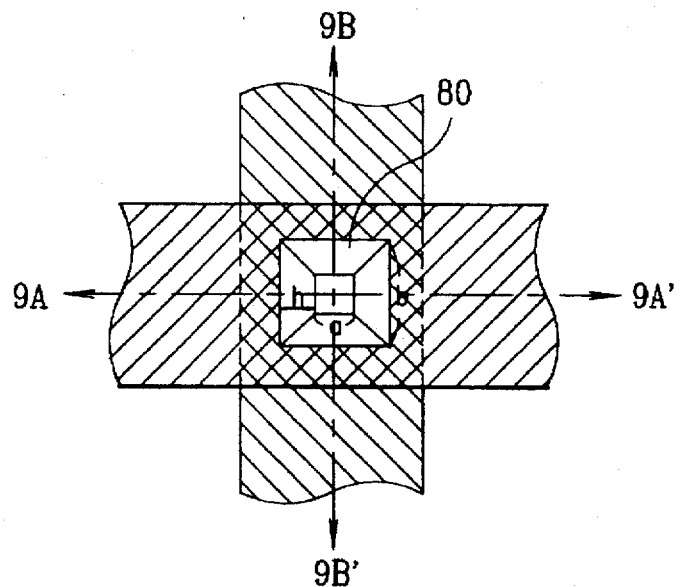
Figure 9C:
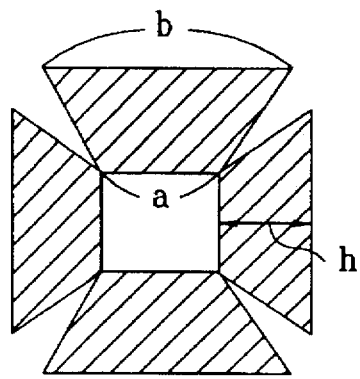
Figure 11A:
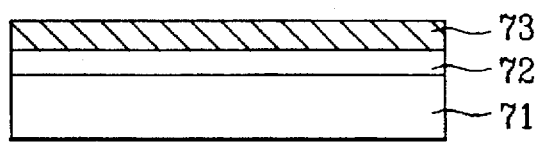
FIGS. 11A–11I show processes for forming the multilayered interconnection of the semiconductor device of FIG. 9B illustrated in sections across line 9B–9B'.
Figure 11B:
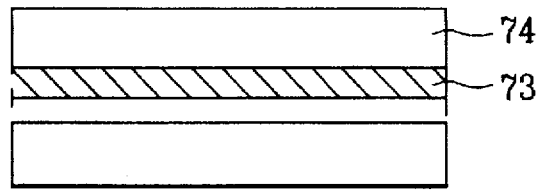
Figure 11C:
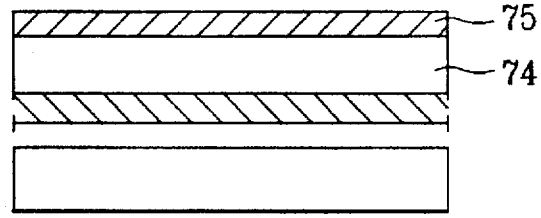
Figure 11D:
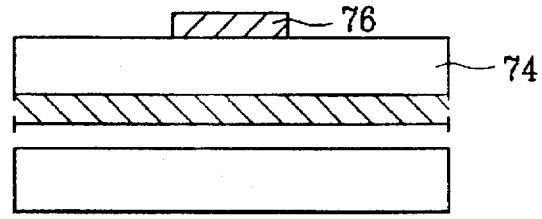

FIGS. 9A–9C show a second of a embodiment multilayered interconnection of a semiconductor device in accordance with this invention, wherein FIG. 9A shows a sectional view, FIG. 9B shows a plan view, and FIG. 9C shows a condition of contact between an upperside interconnection layer and a plug in a contact hole.

Referring to FIGS. 9A to 9C, an underside interconnection layer 73 is formed to be connected to an upperside interconnection layer 76 through a plug 80 formed in a contact hole. An interlayer insulation film 74 is formed between the upperside, and underside interconnection layers 73 and 76 for insulating between them, and an underside insulation film 72 is also formed between a substrate 71 and the underside interconnection layer 73 to provide insulation between them.

The second embodiment of the multilayered interconnection has a contact hole formed up to an upper surface of the upperside interconnection layer 76 with sloped sides at parts the upperside interconnection layer is in contact with the plug 80.

That is, since the dimension of the contact hole is greater at the upper surface of the upperside interconnection layer 76 than at the lower surface of the upperside interconnection layer 76, as shown in FIG. 9B of the plan view, each of the contact surfaces between the upperside interconnection layer 76 and the plug 80 is not rectangular but trapezoidal. Therefore, the contact area between the upperside interconnection layer 76 and the plug 80 is related not only to the dimension of the contact hole at the upper and lower surfaces of the upperside interconnection layer, but also to the deposited thickness of the upperside interconnection layer 76.

Accordingly, as shown in FIG. 9C, if the dimension of the contact hole at the lower surface of the upperside interconnection layer is a square of $a \times a$, the dimension of the contact hole at the upper surface of the upperside interconnection layer is a square of $b \times b$, and the deposited thickness of the upperside interconnection layer 76 is h, the total contact area A2 is $A2 = 4(a+b) \times h/2 = 2(a+b) \times h$.

By comparing the contact areas of the first and second embodiments of the multilayered interconnections and the conventional multilayered interconnection, since it is a tendency that the width of the contact hole (a or b) becomes smaller than the deposition thickness of the upperside interconnection layer h as the contact hole is submicronized, it can be known that the contact area of the first embodiment is greater than the conventional one, and the contact area of the second embodiment is greater than that of the first embodiment.

FIGS. 10A–10I show processes for forming the multilayered interconnection of the semiconductor device of FIG. 9B illustrated in sections across line 9A–9A', and FIGS.11A–11I show processes for forming the multilayered interconnection of the semiconductor device of FIG. 9B illustrated in sections across line 9B–9B'.

As shown in FIGS. 10A to 10D and 11A to and 11D, an underside insulation film 72 is formed of an oxide film on a semiconductor substrate 71 with a chemical deposition method or a spin coating method, on which aluminum is deposited and patterned into an underside interconnection layer 73. An interlayer insulation film 74 is formed of an oxide film on the underside insulation film 72 including the underside interconnection layer 73 with a chemical deposition method or a spin coating method, on which a metal layer 75, such as aluminum, is deposited and patterned into an upperside interconnection layer 76.

Figure 10A:
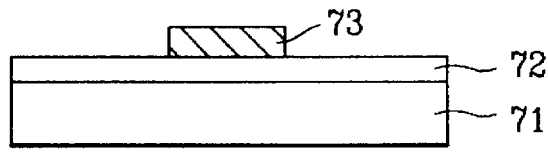
FIGS. 10A–10I show processes for forming the multilayered interconnection of the semiconductor device of FIG. 9B illustrated in sections across line 9A–9A'.
Figure 10B:
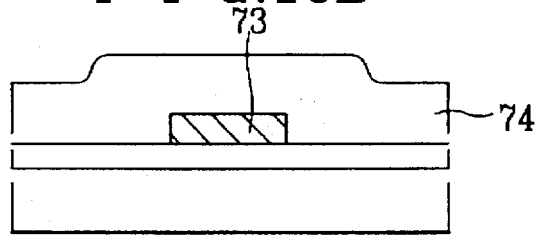
Figure 10C:
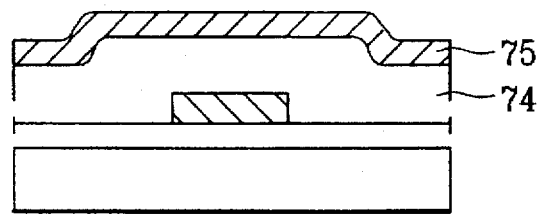
Figure 10D:
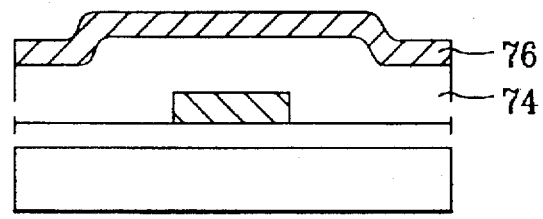
Figure 10E:
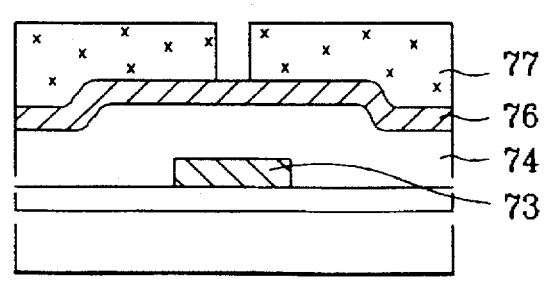
Figure 11E:
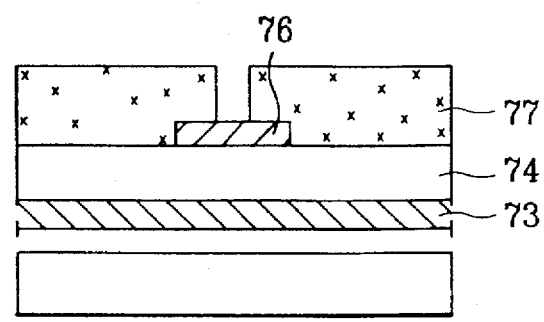
Figure 10F:
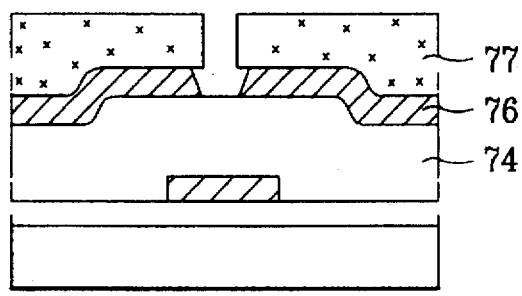
Figure 11F:
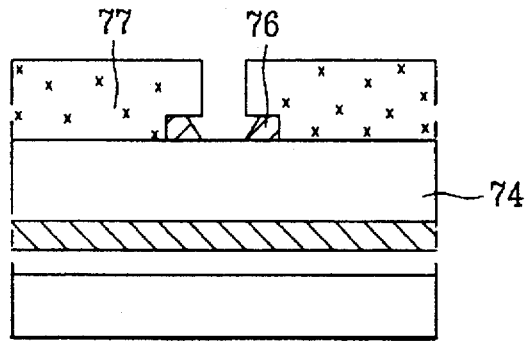

As shown in FIGS. 10E and 11E, a photosensitive film 77 is coated and patterned on the interlayer insulation film 74 including the upperside interconnection layer 76 to expose a part of the upperside interconnection layer 76. Then, as shown in FIGS. 10F and 11F, the exposed upperside interconnection layer is subjected to isotropic etching with the photosensitive film used as a mask to expose the underlying interlayer insulation film 74. The upperside interconnection layer is formed to have sloped surfaces by the isotropic etching.

Figure 10G:
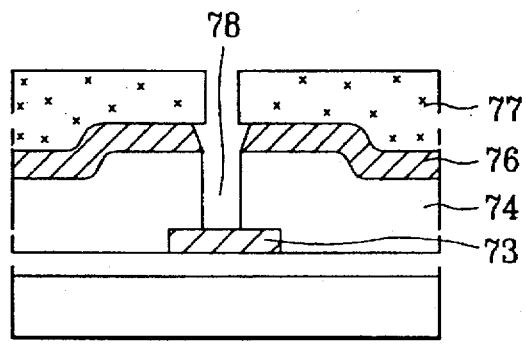
Figure 11G:
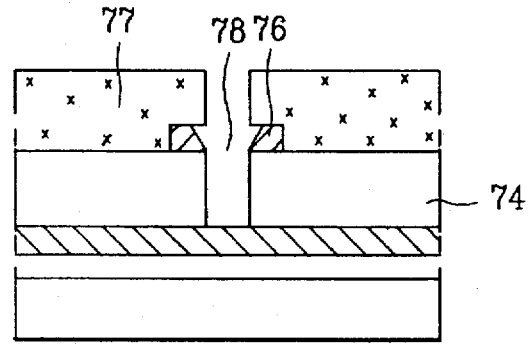

Then, by subjecting the exposed interlayer insulation film to anisotropic etching with the photosensitive film 77 used as a mask, a contact hole 78 as shown in FIGS. 10G and 11G is formed. As a result, the underside interconnection layer 73 is exposed in the contact hole 78. The contact hole 78 formed up to an upper surface of the upperside interconnection layer 76 has trapezoidal side surfaces at the upperside interconnection layer 76, with the dimension at the upper surface being greater than the dimension at the lower surface of the upperside interconnection layer 76.

Figure 10H:
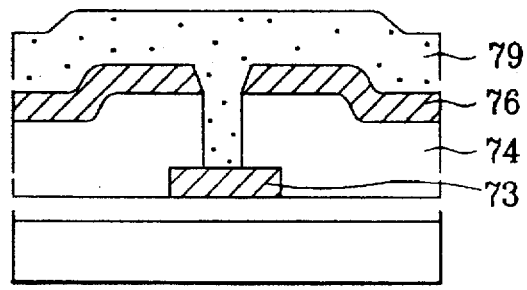
Figure 11H:
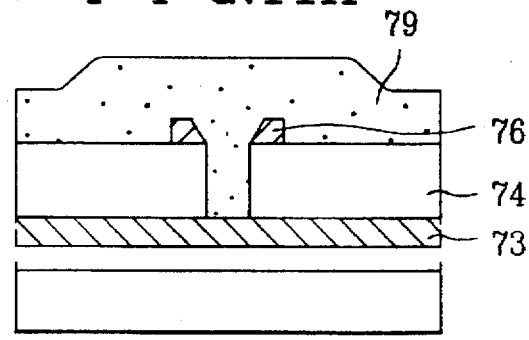
Figure 10I:
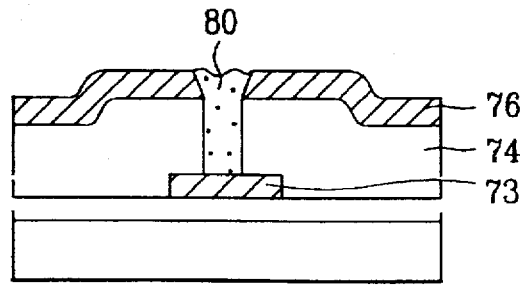
Figure 11I:
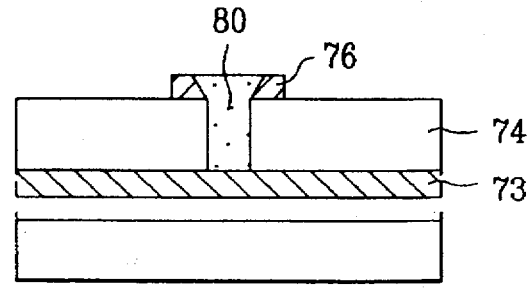

As shown in FIGS. 10H and 11H, a conductive material 79, such as tungsten or aluminum, is deposited on the upperside interconnection layer 76 with by a blanket deposition method so that the contact hole 78 is fully filled, and as shown in FIGS. 10I and 11I, the conductive material 79 is etched back to formed a plug 80 in the contact hole 78.

Herein too, the plug 80 can be formed only in the contact hole 78 by selective growth of the conductive material only in the contact hole 78.

FIGS. 12A–12J show other processes for forming the multilayered interconnection of the semiconductor device of FIG. 9B illustrated in sections across line 9A–9A', and FIGS.13A–13J show the other processes for forming the multilayered interconnection of the semiconductor device of FIG. 9B illustrated in sections across line 9B–9B'.

As shown in FIGS. 12A to 12C and 13A to and 13C, to form the multilayered interconnection of the second embodiment using the other processes, an underside insulation film 72 is formed of an oxide film on a semiconductor substrate 71, on which an upperside interconnection layer 76 is formed by depositing and patterning a metal layer 75 thereon.

An interlayer insulation film 74 is formed of an oxide film on the underside insulation film 72 including the underside interconnection layer 73, on which an upperside interconnection layer 76 is formed.

Figure 12A:
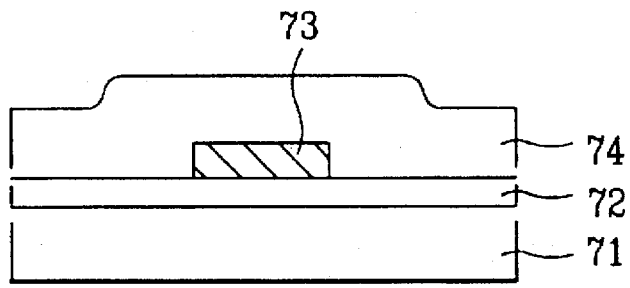
FIGS. 12A–12J show another processes for forming the multilayered interconnection of the semiconductor device of FIG. 9B illustrated in sections across line 9A–9A'.
Figure 12B:
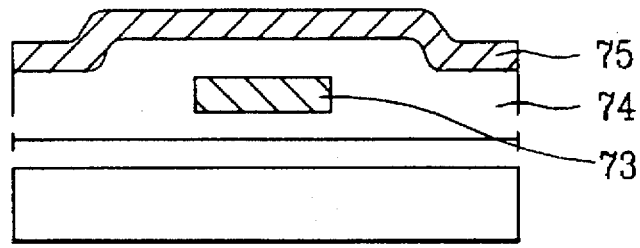
Figure 12C:
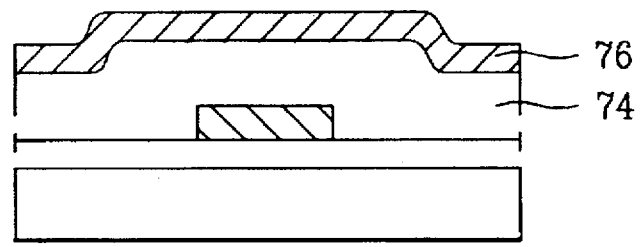
Figure 12D:
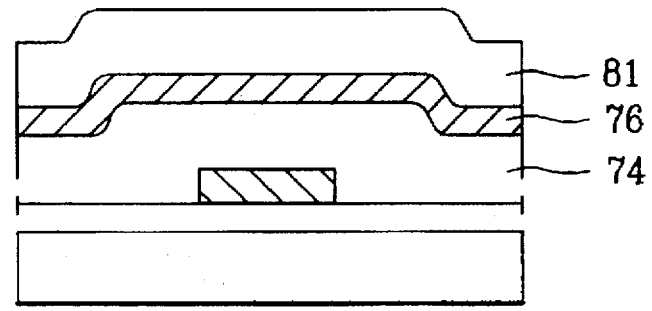
Figure 12E:
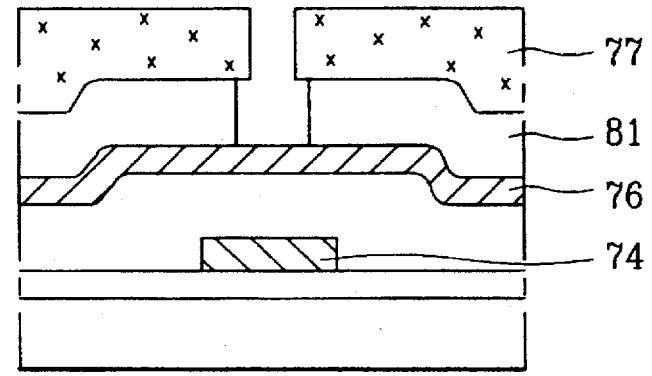

As shown in FIGS. 12D and 13D, an upperside insulation film 81 is formed of an oxide film on the interlayer insulation film 74 including the upperside interconnection layer 76 with a chemical vapor deposition method or a spin coating method, and as shown in FIGS.12E and 13E, by coating and patterning a photosensitive film 77 on the upperside insulation film 81, a part of the upperside insulation film 81 is exposed. Then, the exposed upperside insulation film 81 is etched to expose the underlying underside interconnection layer 76 with the photosensitive film used as a mask. In order to form the contact hole part in the upperside insulation film 81 greater than the contact hole part to be formed on the underside interconnection layer 73, the upperside insulation film 81 is subjected to overetching so that the upperside insulation film 81 is etched more than the contact hole dimension defined by the photosensitive film, by etching the upperside insulation film 81 more than the deposited thickness of the upperside insulation film 81.

Figure 12F:
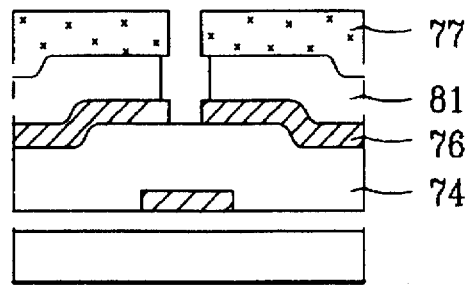
Figure 12G:
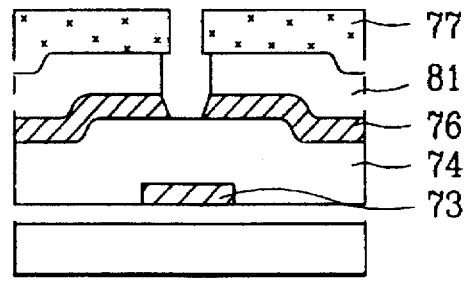
Figure 13F:
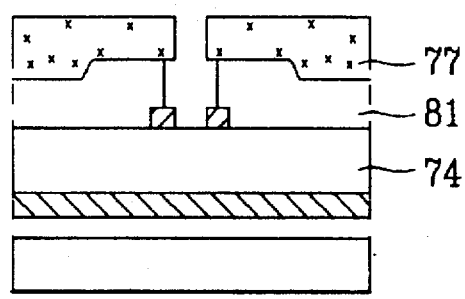
Figure 13G:
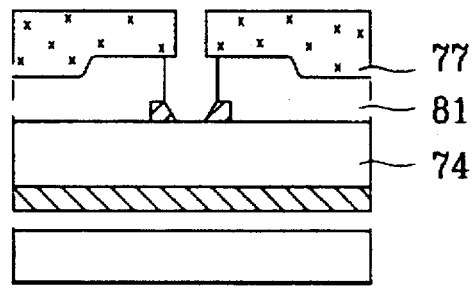

As shown in FIGS. 12F and 13F, the exposed upperside interconnection layer 76 is subjected to anisotropic etching with the photosensitive film 77 used as a mask, and as shown in FIGS. 12G and 13G, exposed edges of the upperside interconnection layer 76 are etched into slopes with a physical etching method, such as an $Ar^+$ sputtering etching method.

Herein, in case the upperside interconnection layer 76 is formed of aluminum, the anisotropic etching is carried out using $Cl_2$ or $BCl_3$ gas.

Figure 12H:
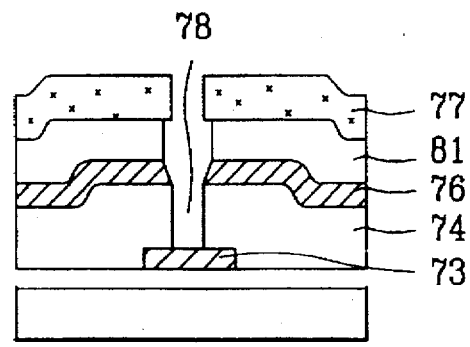
Figure 13H:
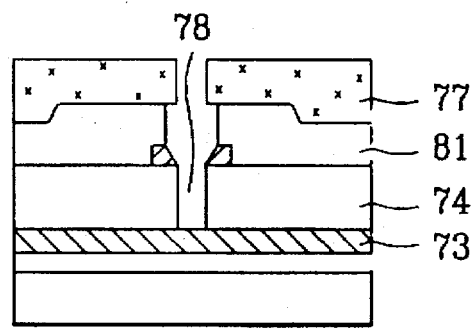

Then, as shown in FIGS. 12H and 13H, by etching the interlayer insulation film 74 with the photosensitive film 77 used as a mask, a contact hole 78 is formed.

In the foregoing process, even though two times of etching processes of the anisotropic etching process of FIGS. 12F and 13F and the slope etching process of FIGS. 12G and 13G have been performed at etching the upperside interconnection layer 76, the slopes of the upperside interconnection layer 76 can be formed by performing one time isotropic etching after the overetching of the upperside insulation film 81.

Figure 12I:
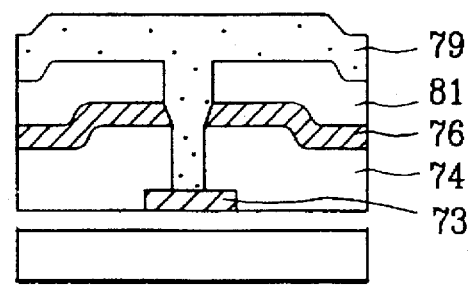
Figure 12J:
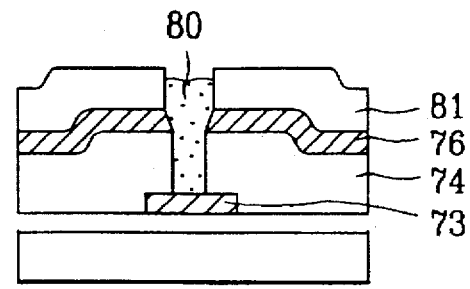
Figure 13I:
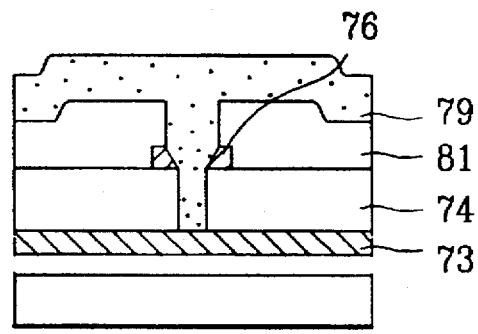
Figure 13J:
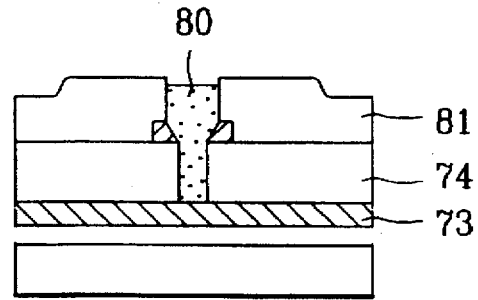

After formation of the contact hole, as shown in FIGS. 12I and 13I, a conductive material 79 is deposited on the upperside insulation film 81 with a blanket deposition method so that the contact hole 78 is fully filled, and as shown in FIGS. 12J and 13J, which conductive material 79 is etched back into a plug 80 in the contact hole 78. The upperside insulation film serves to prevent the upperside interconnection layer from being damaged at etching the conductive material 79.

The plug 80 can be formed only in the contact hole 78 by selective growth of the conductive material 79 only in the contact hole.

This invention as has been explained has the following advantages.

First, since the multilayered interconnection in accordance with this invention increases the contact area by making the plug and the upperside interconnection layer contact at sides of the contact hole, in spite of reduction of dimension of the contact hole, the contact resistance can be reduced. Thus, this invention can provide a multilayered interconnection favorable for high density integration.

Second, with the prevention of the contact area reduction even in time of misalignments of the contact hole formation contact mask and/or the upperside interconnection layer formation mask, which can prevent, not only increase of contact resistance, but also incomplete electric connection between the upperside, and underside interconnection layers, device reliability can be improved significantly.

Third, by forming sloped side surfaces at the part of the contact hole where the plug is in contact with the upperside interconnection layer, occurrence of seam opening can be prevented at forming a multilayered interconnection with a blanket deposition method and an etch back process.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A multilayered interconnection of a semiconductor device comprising:
   a substrate;
   an underside interconnection layer formed above the substrate;
   an interlayer insulation film formed above the underside interconnection layer;
   an upperside interconnection layer formed above the interlayer insulation film;
   a contact hole formed through the upperside interconnection layer and into the interlayer insulation film; and
   a plug formed in the contact hole so that the plug electrically contacts an upper part of the underside interconnection layer and a side of the upperside interconnection, wherein a contact surface of the upperside interconnection layer and the plug is trapezoidal, with the trapezoid being wider at an upper surface of the upperside interconnection layer than at a lower surface of the upperside interconnection layer.

2. The multilayered interconnection of a semiconductor device as claimed in claim 1, further comprising an underside insulation film formed between the substrate and the underside interconnection layer.

3. A multilayered interconnection of a semiconductor device comprising:
   a substrate;
   an underside interconnection layer formed above the substrate;
   an interlayer insulation film formed above the substrate including the underside interconnection layer;
   an upperside interconnection layer formed above the interlayer insulation film;
   a contact hole formed through the upperside interconnection layer and into the interlayer insulation film, the contact hole having the same dimensions at an upper surface of the upperside interconnection layer and a lower surface of the upperside interconnection layer; and
   a plug fully filling the contact hole so that the plug electrically contacts an upper part of the underside interconnection layer and a side of the upperside interconnection layer.

4. The multilayered interconnection of a semiconductor device as claimed in claim 3, wherein a contact surface of the upperside interconnection layer and the plug is rectangular, and wherein an area of contact between the upperside interconnection layer and the plug is related to a size of the contact hole and a thickness of the upperside interconnection layer.

5. A multilayered interconnection of a semiconductor device comprising:
   a substrate;
   an underside interconnection layer formed above the substrate;
   an interlayer insulation film formed above the substrate and on the underside interconnection layer;
   an upperside interconnection layer formed above the interlayer insulation film;
   a contact hole formed through the upperside interconnection layer and into the interlayer insulation film, the contact hole having a dimension greater at an upper surface of the upperside interconnection layer than at a lower surface of the upperside interconnection layer; and
   a plug fully filling the contact hole so that the plug electrically contacts an upper part of the underside interconnection layer and a side of the upperside interconnection layer.

6. The multilayered interconnection of a semiconductor device as claimed in claim 5, wherein a contact surface of the upperside interconnection layer and the plug is trapezoidal, with the trapezoid being wider at an upper surface of the upperside interconnection layer than at a lower surface of the upperside interconnection layer, and wherein an area of contact between the upperside interconnection layer and the plug is related to dimensions of the contact hole at an upper surface of the upperside interconnection layer and a lower surface of the upperside interconnection layer and to a thickness of the upperside interconnection layer.

7. A multilayer interconnection of a semiconductor device, comprising:
   an underside interconnection layer;
   an interlayer insulation film formed above the underside interconnection layer;
   an upperside interconnection layer formed above the interlayer insulation film; and
   a plug formed in electrical contact with both the underside interconnection layer and the upperside interconnection layer, wherein an area of contact between the upperside and the upperside interconnection layer is related to a thickness of the upperside interconnection layer and, wherein a contact surface of the upperside interconnection layer and the plug is trapezoidal.

8. The multilayered interconnection of a semiconductor device as claimed in claim 7, wherein the trapezoid is wider at an upper surface of the upperside interconnection layer than at a lower surface of the upperside interconnection layer.

9. A multilayered interconnection of a semiconductor device comprising:
   a substrate;
   an underside interconnection layer formed above the substrate;
   an interlayer insulation film formed above the underside interconnection layer;
   an upperside interconnection layer formed above the interlayer insulation film;
   a contact hole formed through the upperside interconnection layer and into the interlayer insulation film; and
   a plug formed in the contact hole so that the plug electrically contacts an upper portion of the underside interconnection layer and a side of the upperside interconnection layer, wherein a contact surface of the upperside interconnection layer and the plug is trapezoidal, with the trapezoid being wider at an upper surface of the upperside interconnection layer than at a lower surface of the upperside interconnection layer.

10. The multilayered interconnection of a semiconductor device as claimed in claim 3, wherein a contact surface of the upperside interconnection layer and the plug is rectangular, and wherein an area of contact between the upperside interconnection layer and the plug is related to a size of the contact hole.

11. The multilayered interconnection of a semiconductor device as claimed in claim 5, wherein a contact surface of the upperside interconnection layer and the plug is trapezoidal, with the trapezoid being wider at an upper surface of the upperside interconnection layer than at a lower surface of the upperside interconnection layer, and wherein an area of contact between the upperside interconnection layer and the plug is related to dimensions of the contact hole at an upper surface of the upperside interconnection layer and a lower surface of the upperside interconnection layer.

* * * * *

UNITED STATES PATENT AND TRADEMARK OFFICE
CERTIFICATE OF CORRECTION

PATENT NO. : 5,684,331
DATED : November 4, 1997
INVENTOR(S) : JUN

It is certified that error appears in the above-identified patent and that said Letters Patent is hereby corrected as shown below:

Column 9, Line 14, change "device comprising" to --device, comprising--.

Column 10, Line 41, change "upperside" to --plug--.

Signed and Sealed this

Second Day of February, 1999

Attest:

Attesting Officer

*Acting Commissioner of Patents and Trademarks*